(12) United States Patent
Swanson

(10) Patent No.: US 6,455,393 B1
(45) Date of Patent: Sep. 24, 2002

(54) AIR BRIDGE/DIELECTRIC FILL INDUCTORS

(75) Inventor: Leland S. Swanson, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/677,456

(22) Filed: Oct. 2, 2000

Related U.S. Application Data

(60) Provisional application No. 60/174,066, filed on Dec. 30, 1999.

(51) Int. Cl.$^7$ ................................................ H01L 21/76
(52) U.S. Cl. ...................... 438/422; 438/221; 438/459; 438/692
(58) Field of Search ................................. 438/221, 219, 438/218, 459, 692, 974, 148, 135, 618, 6, 422, 977, 967

(56) References Cited

U.S. PATENT DOCUMENTS 5,332,469 A * 7/1994 Mastrangelo .................. 216/2

* cited by examiner

Primary Examiner—Olik Chaudhuri
Assistant Examiner—Yennhu B. Huynh
(74) Attorney, Agent, or Firm—W. James Brady; Frederick J. Telecky, Jr.

(57) ABSTRACT

A method of fabricating an integrated circuit having active components, conductors and isolation regions on a substrate is disclosed, including patterning and etching a portion of at least one of said isolation regions to expose a first area of said substrate, depositing a mask layer over said integrated circuit including said first area, patterning an a itching said mask layer to expose a second area of said substrate within said first area, converting a portion of said substrate to a selectively etchable material, wherein said selectively etchable material lies in an area subjacent to said second area and extends only partially to the bottom surface of said substrate, selectively etching said selectively etchable material to form a void, removing said mask layer to expose said isolation region, depositing a dielectric layer over said void wherein said dielectric layer extends at least to the height of said isolation region and covers the top surface of said wafer, polishing the surface of said dielectric layer until the surface is planar and the top surface of said isolation region is exposed, and forming at least one patterned conductive layer over the surface of said dielectric layer that is coplanar with the surface of said isolation region.

32 Claims, 7 Drawing Sheets

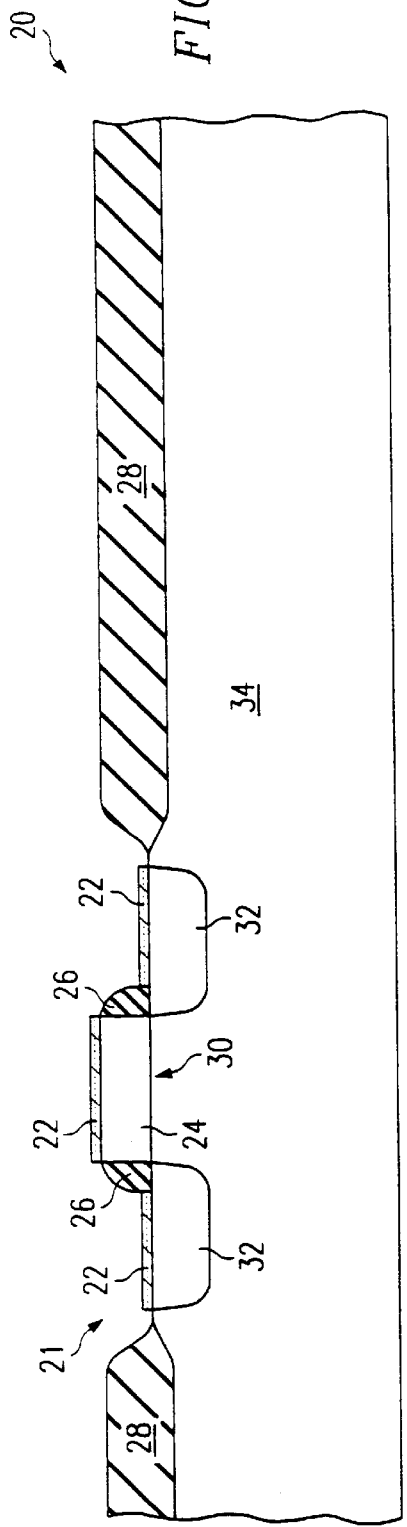
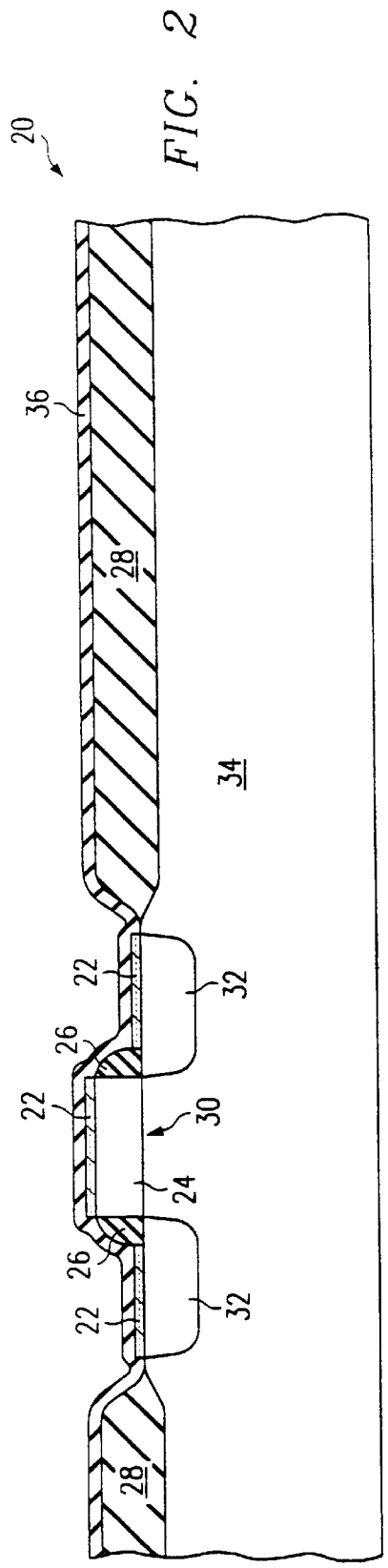

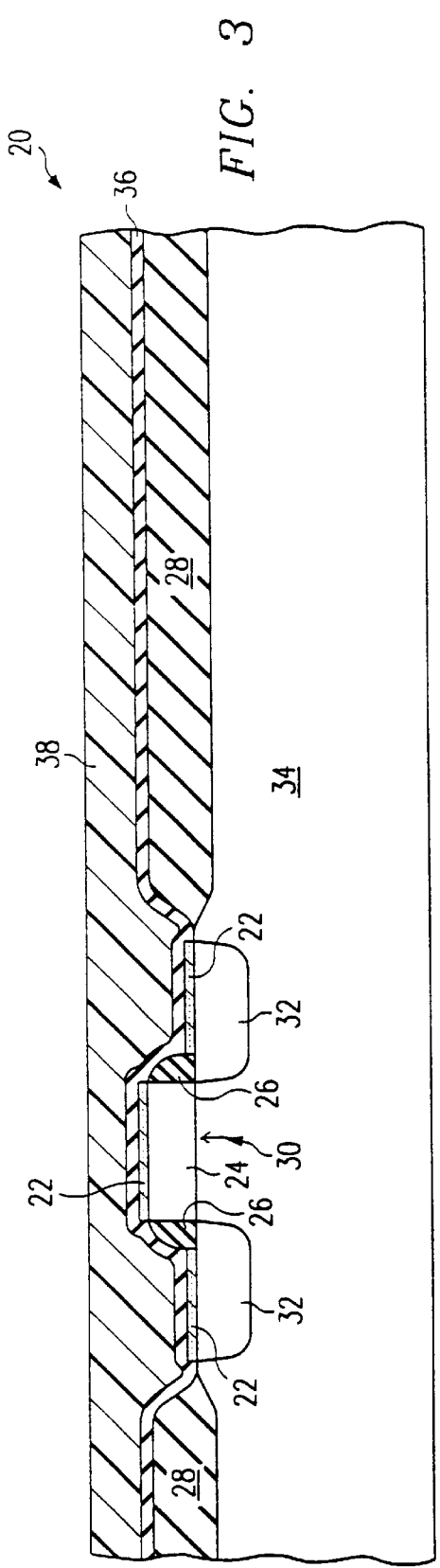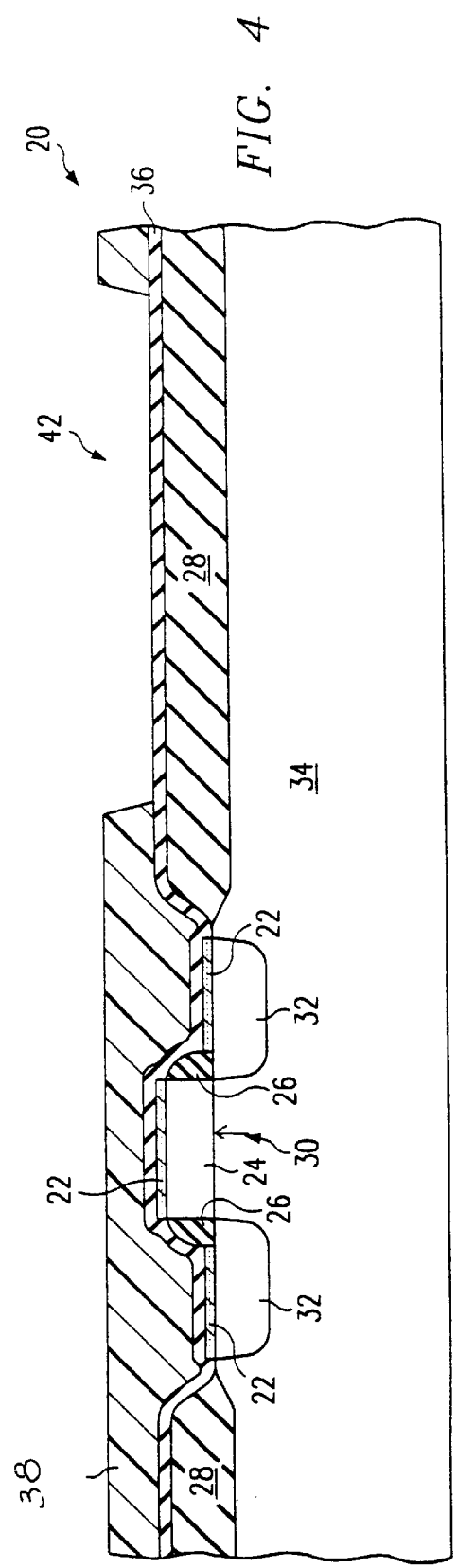

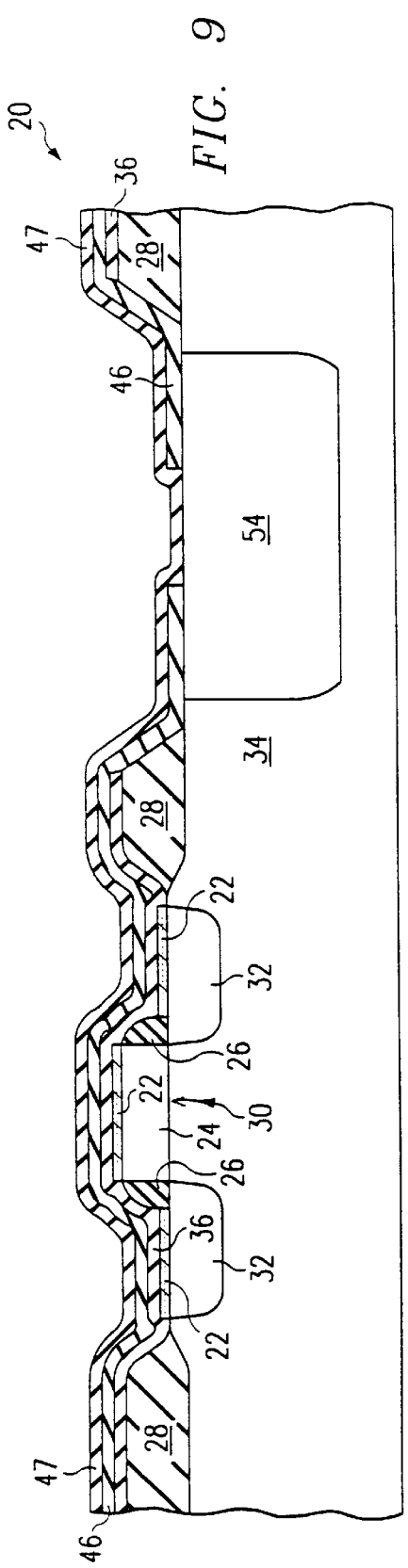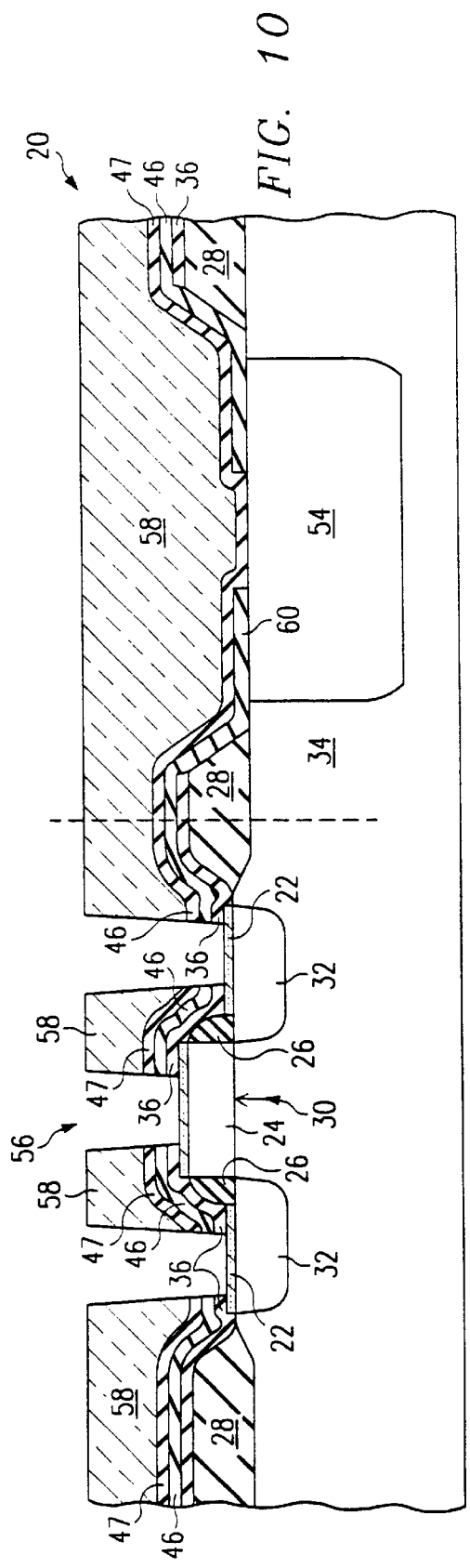

AIR BRIDGE/DIELECTRIC FILL INDUCTORS

This application claims priority under 35 USC § 119(e)(1) of provisional application No. 60/174,066 filed Dec. 30, 1999.

FIELD OF THE INVENTION

This invention relates, in general, to integrated circuit structures and fabrication methods and, in particular, to isolation of circuit components using the etching of porous silicon areas followed by a dielectric backfill; including decoupling of circuit structure radio frequency transmission lines from a semiconductor substrate to minimize parasitics.

BACKGROUND OF THE INVENTION

Integrated circuits have been designed to ever-smaller geometries, and required to carry signals of ever-increasing frequencies. As integrated circuit components and signal lines are placed more closely together, and as the frequencies at which the components and signal lines operate are increased to radio frequencies (RF), the components and signal lines strongly couple electromagnetically to the substrate. This results in low power efficiency and restricts the maximum frequency at which the integrated circuit can function.

Previous methods have attempted to overcome the problem of coupling by increasing space between radiant components and receptive components, which results in larger die area and increased design costs. Other previous techniques have boosted the voltage levels of low voltage signals requiring a high degree of isolation; resulting in lower power efficiency and relatively high power emissions that may couple undesirably with other signals.

Previous designs. have used trenches to isolate components from a substrate; but such attempts typically fail to yield the 100 decibels (dB) of isolation necessary to integrate systems comprising mixed signal devices (such as base band, phase-locked-loop, or voltage controlled oscillators) or functionally distinct circuits requiring different power levels (such as transmitter or receiver) on the same substrate.

Even by changing the substrate, or isolating the component from the substrate, the degrees of isolation necessary to integrate many RF systems on a single chip have not been achieved. Thus, commercially viable isolation of RF components from the substrate is now needed.

SUMMARY OF THE INVENTION

Therefore, a method for fabricating an integrated circuit having active components, high frequency conductors and isolation regions on a substrate is now needed; providing enhanced design performance while overcoming the aforementioned limitations of conventional methods.

The present invention provides integrated circuit structures and fabrication methods, including techniques using the etching of porous silicon areas and dielectric backfill to provide isolation for circuit components. The present invention provides for isolation of circuit components, including decoupling of RF transmission lines on a circuit structure from a semiconductor substrate, to minimize parasitics. The present invention provides a method of fabricating an integrated circuit having active components, conductors and isolation regions on a substrate.

An embodiment of the present invention comprises patterning and etching at a portion of at least one of the isolation regions to expose a first area of the substrate; depositing a layer of silicon carbide (or other material resistant to a porous silicon formation process) over the substrate including the first area, patterning and etching the silicon carbide layer to expose a second area of substrate within the first area, forming a porous silicon region in at least the second area using HF (Hydrogen Fluoride), wherein the silicon carbide layer protects the active areas from the HF, forming at least one dielectric layer over the substrate, forming at least one patterned metallization layer over the dielectric layer, removing the porous silicon from the backside to form a void, and backfilling the void left,by the removal with a dielectric.

One embodiment of the present invention may form angled sidewalls having a slope between 30° and 60° degrees via the step of patterning and etching the isolation regions. This formation can comprise an isotropic plasma etch using $CF_4/O_2$, as well as an HF etch.

The present invention may comprise forming an oxide layer over the substrate patterned metallization comprising RF transmission lines; where the removal of porous silicon and backfilling with dielectric decouples RF transmission lines on the circuit structure from the semiconductor substrate to minimize parasitics.

In one embodiment of the present invention, the step of depositing a layer of silicon carbide is accomplished by using a silicon carbide layer with a thickness in the range of 500–5000 Å.

In another embodiment of the present invention, the fabrication of an RF integrated circuit having active components, high frequency conductors and isolation regions on a substrate, comprises the forming of isolation regions in a substrate; forming active components in said substrate; patterning at least one of the isolation regions to expose a first area of said substrate; etching away some of the field oxide; forming a patterned masking layer of silicon carbide over said substrate, preferably by Plasma Enhanced Chemical Vapor Deposition (PECVD); patterning and etching the silicon carbide layer to expose a second area of the substrate within the first area; anodizing the porous silicon region; exposing the porous silicon from the backside, e.g., by back grinding; removing the porous silicon from backside; and spin-coating on glass to fill voids left by the removal.

In some embodiments, especially those for high frequency applications, a low-dielectric constant material, such as porous silicon dioxide, e.g., as formed by an aerogel or HSQ process, is used as the dielectric, filling the voids left by the removal of the porous silicon.

A stabilizing material, such as a photoresist, can be used to level and strengthen the topside of the wafer, prior to the back-grinding step. The steps of back-grinding, removal of the porous silicon, and back-filling with dielectric may all be done in the same machine to avoid handling of the wafer while it is in a relatively fragile condition.

In one embodiment, there is a step of drying out porous silicon at 100–200° C. in vacuum for 6 to 24 hours, then heating in oven at 300–400° C. in oxygen for 1 hour; shifting from oxygen to nitrogen, to reduce the oxygen concentration in the porous silicon before depositing a capping layer.

In another embodiment, the anodization to form porous silicon is continued until the porous silicon extends entirely through the substrate and the need for back-grinding is eliminated.

The present invention may thus be utilized for isolation in general, not just to decouple conductors from the substrate to minimize RF parasitics. Areas in a substrate may be isolated from one another, even down to an individual transistor level, if desired.

BRIEF DESCRIPTION OF THE DRAWINGS

For a complete understanding of the present invention, including its features and advantages, reference is now made to the detailed description of the invention taken in conjunction with the accompanying drawings in which like numerals identify like parts and in which:

FIG. 1 is a schematic illustration of a transistor and field oxide structure;

FIG. 2 is a schematic illustration of the structure of FIG. 1, with an additional layer of silicon dioxide added, e.g., by a Plasma Enhanced Chemical Vapor Deposition (PECVD);

FIG. 3 is a schematic illustration of the structure of FIG. 2, with a layer of photoresist spun-on;

FIG. 4 is a schematic illustration of patterned photoresist leaving an exposed area of silicon dioxide over the site where Porous Silicon (PS) is to be formed;

FIG. 9 is a schematic illustration of the structure after a porous silicon region has been anodized in the substrate;

FIG. 10 is a schematic illustration of vias cut through Intra-Layer Dielectric (ILD), SiC and TEOS to expose silicide areas on the transistor, using a three (3) step etch;

DETAILED DESCRIPTION OF THE INVENTION

Figure 5:
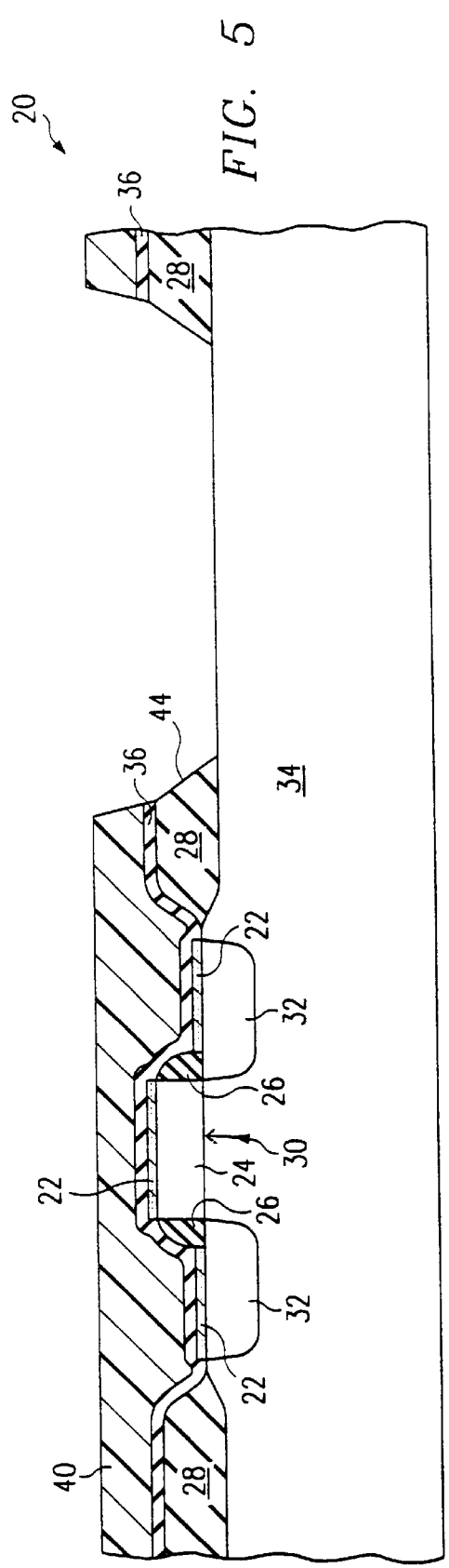
FIG. 5 is a schematic illustration of silicon dioxide etched with tapered slope down to the Si substrate.

While the making and using of various embodiments of the present invention are discussed in detail below, it should be appreciated that the present invention provides many applicable inventive concepts which can be embodied in a wide variety of specific contexts. The specific embodiments discussed herein are merely illustrative of specific ways to make and use the invention, and do not delimit the scope of the invention.

A process for forming selective porous silicon (PS) areas according to a first embodiment of the invention will now be discussed in further detail. In this embodiment, the silicon carbide (SiC) masking layer is deposited after the transistor silicide process. Referring to FIG. 1, a semiconductor wafer during fabrication process is depicted as 20 showing substrate 34 having a transistor 21 having poly gate 24, side walls 26, gate oxide 30, and source/drain implants 32 formed therein. The device has been processed through isolation regions 28 and transistor 21 formation. Transistor 21 has been fabricated through silicide 22 formation and anneal. Isolation regions 28 are shown as field oxide regions.

Referring to FIG. 2, an oxide layer 36 may be deposited at this point. This oxide layer may be deposited by, for example, PETEOS, to a thickness on the order of 500–10,000 Å.

Next, a resist layer 38 is formed over the surface as shown in FIG. 3. The resist layer 38 is patterned as shown in FIG. 4 to expose an area 42 of isolation region 28. Area 42 is located over the desired PS site. Then, the oxide of isolation regions 28 is etched, preferably leaving sidewalls 44 having a slope between 30° and 60° degrees, as shown in FIG. 5. This may, for example, be accomplished in one of the following two ways: (1) an isotropic plasma etch using $CF_4/O_2$ or its equivalent or (2) an HF deglaze. Resist layer 38 is then removed using standard ash/cleanup processes. The above oxide pattern and etch steps may alternatively be performed prior to transistor formation.

A p+ diffusion of boron or similar dopant may be performed prior to the transistor formation to convert the p– epi to p+ with resistivity on the order of 0.01-cm. If necessary, a deglaze to remove the boron or similar dopant contaminated oxide is then performed.

Figure 6:
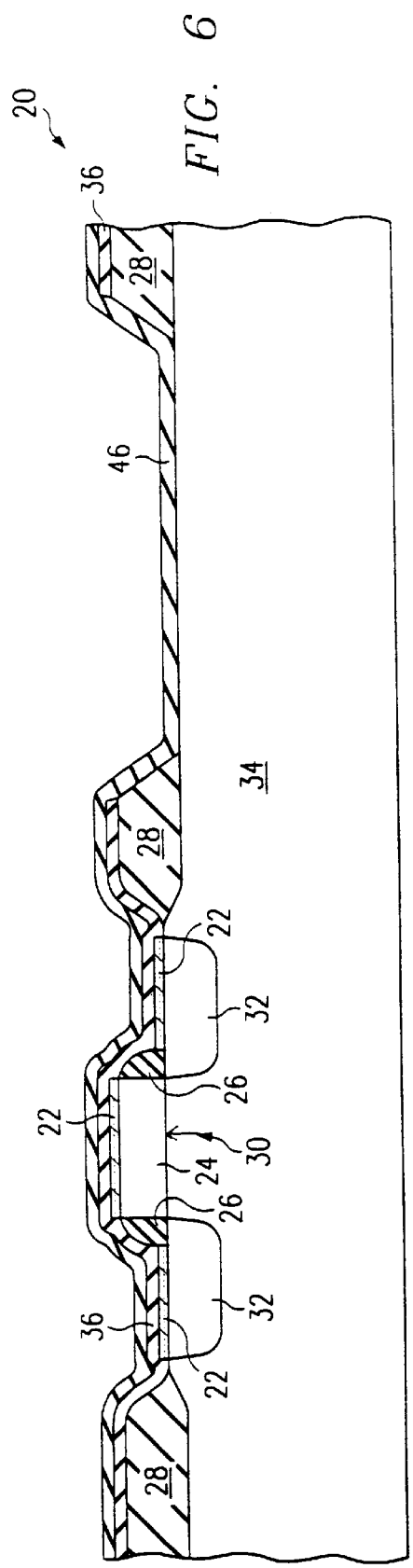
FIG. 6 is a schematic illustration of process after photoresist has been removed and after a layer of silicon carbide has been deposited.

Referring to FIG. 6, a masking layer 46 of SiC is deposited over the structure. Layer 46 may typically have a thickness in the range of 500 to 5000 Å. The following process may be used: PECVD (plasma-enhanced chemical vapor deposition) using silane/methane, trimethylsilane, tetramethylsilane or other organosilicon precursor gas and Ar or He as carrier gas. The pressure may be on the order of 5 Torr. The gas flow may be in the range of 500–5000 sccm. RF power density may be on the order of 2 $W/cm^2$ (13.56 MHZ). The substrate temperature may be in the range of 200–500° C. If desired, a double deposition step (using the same conditions) may be used to reduce defects.

Figure 7:
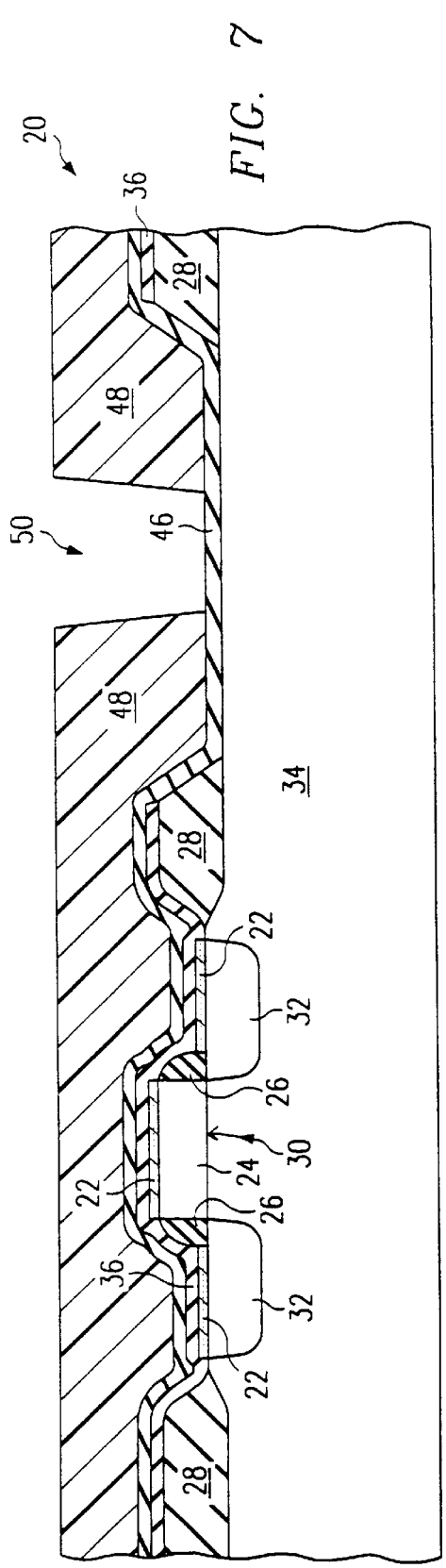
FIG. 7 is a schematic illustration of the structure after a second layer of photoresist has been deposited and patterned.

Next, a second resist mask 48 is formed over the SiC masking layer 46. The second resist mask 48 is patterned to expose a portion 50 of SiC masking layer 46 approximately in the center of where the PS region is desired, as shown in FIG. 7. The exposed portion 50 is generally significantly smaller than the width of the desired PS region. The relationship between the size of portion 50 and the desired PS region is optimized based on the PS formation process parameters.

Figure 8:
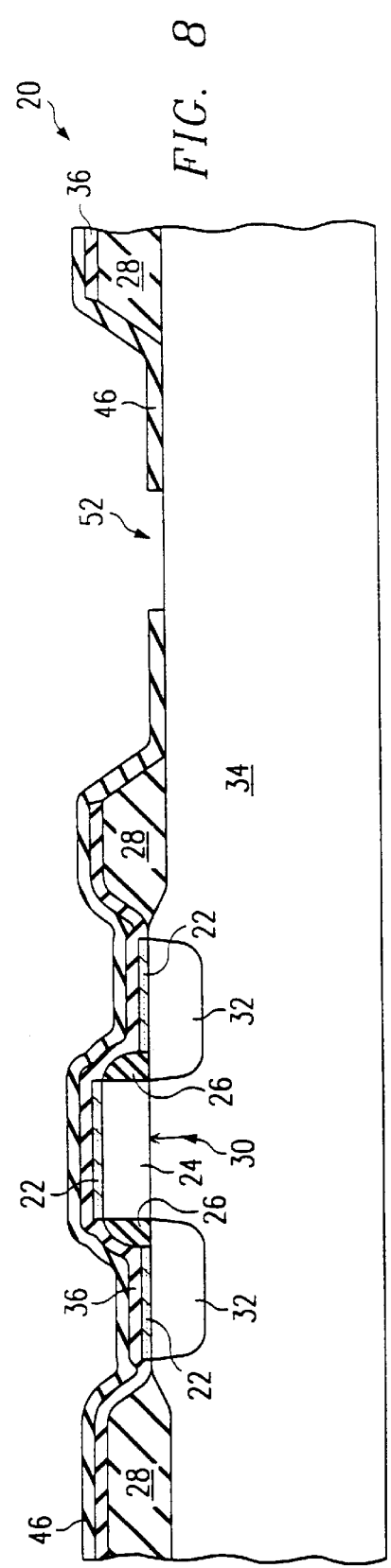
FIG. 8 is a schematic illustration of Si area exposed after a carbon tetrafluoride RIE etch and photoresist strip.

Referring to FIG. 8, the exposed portion 50 of SiC masking layer 46 is removed. The following are some exemplary methods for removing portion 50 of SiC masking layer 46. (1) $Cl_2/O_2$ based etch using a chamber pressure: 300 mTorr (gas flow 10–50 sccm), $O_2$ fraction 0–90%, and RF Power density 0.5–1 $W/cm^2$ (13.56 MHZ); (2) $CF_4/O_2/H_2$ based etch using an $O_2$ fraction 0–90%, $H_2$ flow 0–20 sccm, (fluorinated-$O_2$ gas flow 10–50 sccm),chamber pressure; 10–50 mTorr, and RF Power density 0.5–1 $W/cm^2$ (13.56 MHZ); (3) $SF_6/O_2/H_2$ based etch using $O_2$ fraction 0–90%, $H_2$ flow 0–20 sccm, (fluorinated-$O_2$ gas flow 10–50 sccm), chamber pressure: 10–50 mTorr, and RF Power density 0.5–1 $W/cm^2$ (13.56 MHZ); and (4) $CHF_3/CF_4/Ar/O_2/H_2$ based etch using an $O_2$ fraction 0–50%, $H_2$ flow 0–100 sccm, (fluorinated-Ar gas flow 50–200 sccm), chamber pressure: 10–50 mTorr, and RF Power density 0.5–1

W/cm² (13.56 MHZ). Second resist layer 52 is then removed to give the structure shown in FIG. 8.

Next, the PS regions 54 are formed by anodization, as shown in FIG. 9. The thickness of PS region 54 may vary between 10 µm and the wafer thickness, depending on the application. Typically, PS region 54 may be in the range of 10–200 µm. Any suitable anodization method may be used. For example, the porosity may be in the range of 45–70% and the current density may be in the range of 50–200 mA/cm2. Since the wafers used will typically be either p–, or have a p+ substrate with a p– epi layer on top, the electrolyte may have a larger than usual HF concentration, such as 50–70% (49%) HF. The electrolyte generally contains a surfactant such as isopropyl alcohol, and optionally additional water. Higher HF concentrations may be necessary to prevent the porosity of the PS in the p– from becoming too large and then cracking, while at the same time maintaining reasonable etch rates during anodization.

Under certain anodization conditions, the SiC mask may also crack as the etch proceeds beneath it. To avoid this, the anodization current density may initially be started at low levels and gradually increased to the desired level during the first 30–50% of the etch. This way the latter part of the etch may proceed at a high rate, again keeping the overall etch time reasonable. After the formation of the PS region 54, a capping layer of silicon carbide or other dielectric 47 may be deposited over the exposed porous silicon region as shown in FIG. 9.

Referring to FIG. 10, an interlayer dielectric (ILD) 58 is deposited. ILD 58 typically comprises a PECVD TEOS. However, other ILD materials may alternatively be used such as fluorosilicate glass, high density, plasma TEOS, silicon nitride or spin-on glass.

The ILD 58 is then patterned and a contact etch is performed to etch through the ILD 58, SiC masking layer 46 and the oxide layer down to the silicide 22, as shown in FIG. 10. A multi-step etch is used, because an etch that will remove both SiC and SiO₂ will probably have poor selectivity between the dielectrics and the silicide, and most likely cut into the silicide. Without the multi-step etch, poor process control may result.

Figure 11:
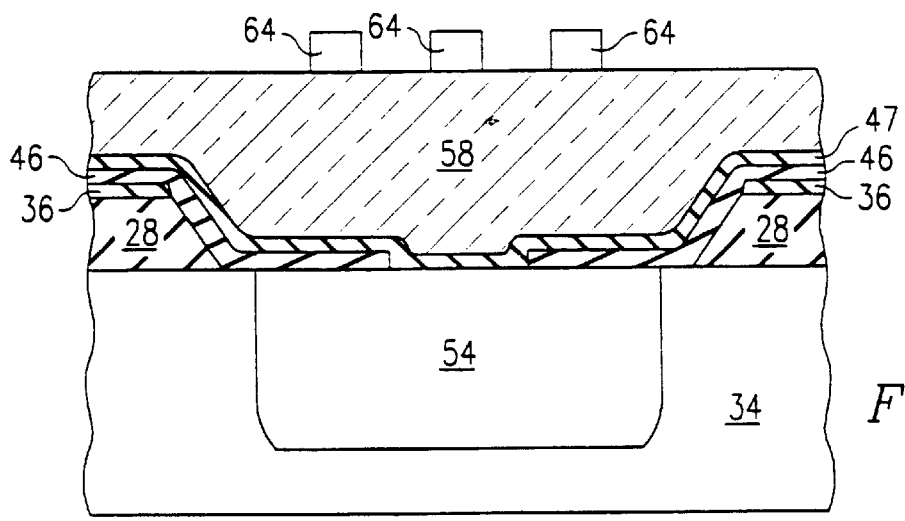
FIG. 11 is a schematic illustration after deposition of a first dielectric layer, and after inductor metallization has been deposited and patterned.

Referring to FIG. 11, a schematic illustration of only the right portion of the preceding figures is shown after deposition of a first dielectric layer after inductor 64 metallization has been deposited and patterned.

Figure 12:
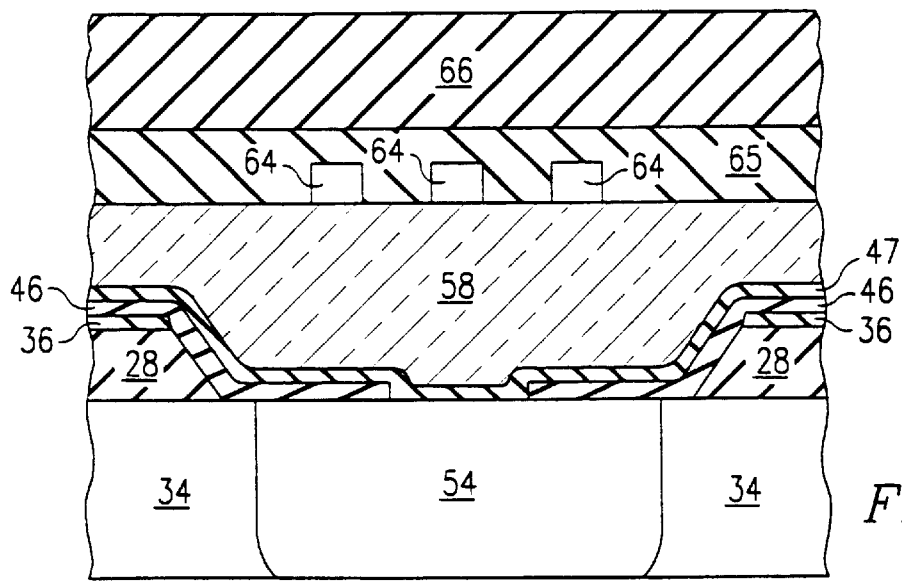
FIG. 12 is a schematic illustration of the structure, after deposition of a second dielectric layer and after a support layer of, e.g., photoresist has been added on the wafer topside and after grinding of the wafer backside.

Referring to FIG. 12, a second dielectric layer 65 is added followed by a strengthening layer of photoresist 66 and then followed by a back-grinding 62 step which exposes the porous silicon from the backside.

Figure 13:
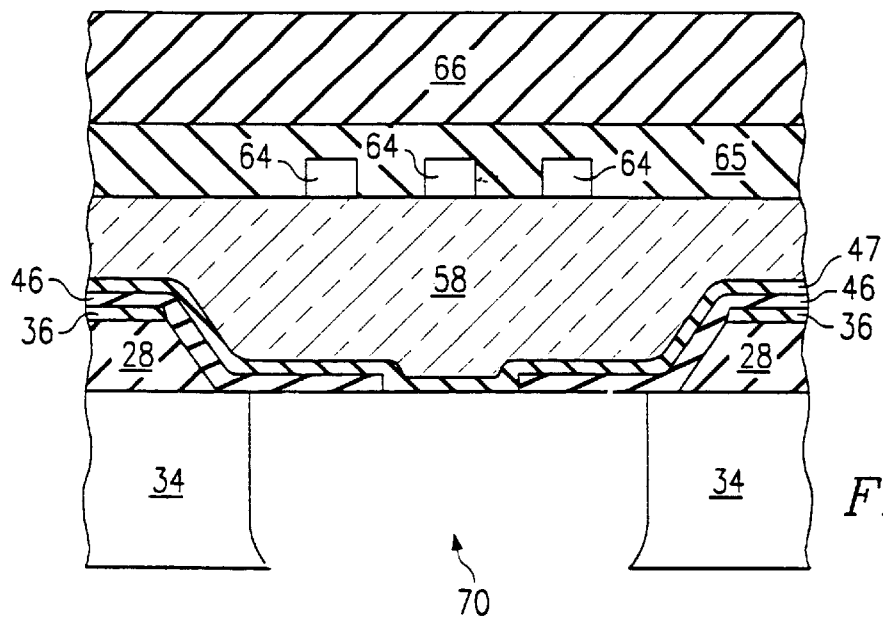
FIG. 13 is a schematic illustration of the structure after the porous silicon has been removed, e.g., by backside wet-etching.
Figure 14:
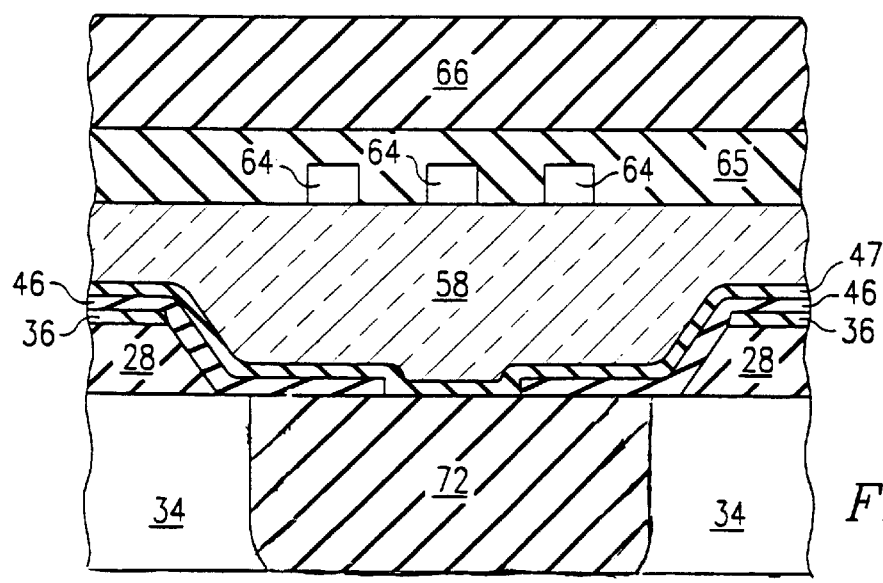
FIG. 14 is a schematic illustration of the structure after a dielectric has been used in a backside filling of the void left by the porous silicon removal.

Referring to FIG. 13, the exposed porous silicon is then removed from the backside by the process of wet etching to leave a void 70. Voids left by removal of the porous silicon are back-filled with dielectric fill 72 and planarized as shown in FIG. 14. The steps of back-grinding, removal of the porous silicon, and back-filling with dielectric may all be done in the same machine, to avoid handling of the wafer while it is in a relatively fragile condition.

In a second embodiment, the silicon carbide (SiC) masking layer is deposited after the transistor silicide process. Referring to FIG. 1, a semiconductor wafer during fabrication process is depicted as 20 showing substrate 34 having a transistor 21 having poly gate 24, side walls 26, gate oxide 30, and source/drain implants 32 formed therein. The device has been processed through isolation regions 28 and transistor 21 formation. Transistor 21 has been fabricated through silicide 22 formation and anneal. Isolation regions 28 are shown as field oxide regions.

Referring to FIG. 2, an interlayer dielectric (ILD) 36 may be deposited at this point as a Pre-Metal Deposition (PMD) layer. This layer may be deposited by, for example, PETEOS, to a thickness on the order of 3000–10,000 Å. The resulting surface may then be planarized by Chemical Mechanical Polishing (CMP).

Next, a resist layer 38 is formed over the surface as shown in FIG. 3. The resist layer 38 is patterned as shown in FIG. 4 to expose an area 42 over the isolation region 28. Area 42 is located over the desired PS site. Then, the oxide of isolation regions 28 is wet oxide etched (using HF), preferably leaving sidewalls 44 having a slope between 30° and 60° degrees, as shown in FIG. 5. This may, for example, be accomplished in one of the following two ways: (1) an isotropic plasma etch using CF₄/O₂ or its equivalent or (2) an HF deglaze. Resist layer 38 is then removed using standard ash/cleanup processes.

A p+ diffusion of boron or similar dopant may be performed prior to the transistor formation to convert the p– epi to p+ with resistivity on the order of 0.01-cm. A shallow implant or diffusion of Boron will also be required on the backside of p– wafers to convert the backside surface to p+ and prevent charge inversion during the PS anodization step. If necessary, a deglaze to remove the boron or similar dopant contaminated oxide is then performed. Referring to FIG. 6, a masking layer 46 of SiC is deposited over the structure. Layer 46 may typically have a thickness in the range of 1000 to 5000 Å. The following process may be used: PECVD (plasma-enhanced chemical vapor deposition) using silane/methane, trimethylsilane, tetramethylsilane or other organo-silicon precursor gas and Ar or He as carrier gas. The pressure may be on the order of 5 Torr. The gas flow may be in the range of 500–5000 sccm. RF power density may be on the order of 2 W/cm² (13.56 MHZ). The substrate temperature may be in the range of 200–500° C. If desired, a double deposition step (using the same conditions) may be used to reduce defects.

Next, a second resist mask 48 is formed over the SiC masking layer 46. The second resist mask 48 is patterned to expose a portion 50 of SiC masking layer 46 approximately in the center of where the PS region is desired, as shown in FIG. 7. The exposed portion 50 is generally significantly smaller than the width of the desired PS region. The relationship between the size of portion 50 and the desired PS region is optimized based on the PS formation process parameters. The width of the desired PS region may be smaller than the width of the substrate 34 that is directly covered by the SiC masking layer; the width of substrate 34 in excess of the width of the desired PS region may be used in later process steps to provide a suitable horizontal surface upon which structures for contacting upper-layer metallization may be made.

Referring to FIG. 8, the exposed portion 50 of SiC masking layer 46 is removed. The following are some exemplary methods for removing portion 50 of SIC masking layer 46. (1) Cl₂/O₂ based etch using a chamber pressure: 300 mTorr (gas flow 10–50 sccm), O₂ fraction 0–90%, and RF Power density 0.5–1 W/cm² (13.56 MHZ); (2) CF₄/O₂/H₂ based etch using an O₂ fraction 0–90%, H₂ flow 0–20 sccm, (fluorinated-O₂ gas flow 10–50 sccm),chamber pressure; 10–50 mTorr, and RF Power density 0.5–1 W/cm² (13.56 MHZ); (3) SF₆/O₂/H₂ based etch using O₂ fraction 0–90%, H₂ flow 0–20 sccm, (fluorinated-O₂ gas flow 10–50 sccm),chamber pressure: 10–50 mTorr, and RF Power density 0.5–1 W/cm² (13.56 MHZ); and (4) CHF₃/CF₄/Ar/O₂/H₂ based etch using an O₂ fraction 0–50%, H₂ flow 0–100 sccm, (fluorinated-Ar gas flow 50–200 sccm),chamber pressure: 10–50 mTorr, and RF Power density 0.5–1 W/cm² (13.56 MHZ). Second resist layer 52 is then removed to give the structure shown in FIG. 8.

Next the PS regions are formed by anodization. The thickness of the PS region may vary between 10 □m and the wafer thickness, depending on the application. Typically, the PS region may be in the range of 10–300 □m. Any suitable anodization, method may be used. For example, the porosity may be in the range of 45–70% and the current density may be in the range of 50–200 mA/cm2. Since the wafers used will typically be either p–, or have a p+ substrate with a p– epi layer on top, the electrolyte may have a larger than usual HF concentration, such as 50–70% (49%) HF. The electrolyte generally contains a surfactant such as isopropyl alcohol, and optionally additional water. Higher HF concentrations may be necessary to prevent the porosity of the PS in the p– from becoming too large and then cracking, while at the same time maintaining reasonable etch rates during anodization. The anodization chemistry may comprise a ratio by volume of 60:30:10 of an HF solution, an alcohol, and deionized water.

Under certain anodization conditions, the SiC mask may also crack as the etch proceeds beneath it. To avoid this, the anodization current density may initially be started at low levels and gradually increased to the desired level during the first 30–50% of the etch. This way the latter part of the etch may proceed at a high rate, again keeping the overall etch time reasonable.

The exposed porous silicon Is then removed by the process of wet etching to leave a void. The etch chemistry may comprise a radon by volume of 10:6:50 of a buffered HF solution (~40% NH₄F and ~4.5% HF), an alcohol, and a peroxide solution (~30% H₂O₂). The SiC masking layer may then be removed by a chlorine based Reactive Ion Etch (RIE)

A dielectric layer such as an SOG (Spun-On-Glass) Is deposited over the conductive layer so that the dielectric layer extends at least to the height of the isolation region and interlayer dielectric The SOG may be densified by baking it in a furnace at between 200 □ and 330 □ degrees Celsius for one hour.

The surface of wafer is then planarized by an oxide CMP process down to the interlayer dielectric of isolation region.

The dielectric layer may be patterned and etched to expose silicide regions of the transistor structure so that silicide regions can have metal contacts attached to them.

Inductor metallization is then deposited and patterned.

The wafer is thinned by a back-grinding step which optionally exposes the dielectric layer depending on extent of the back-grinding.

While the making and using of various embodiments are discussed in detail below, it should be appreciated that the present invention provides many applicable inventive concepts which can be embodied in a wide variety of specific contexts. The specific embodiments discussed herein are merely illustrative of specific ways to make and use the invention, and do not delimit the scope of the invention.

What is claimed is:

1. A method of fabricating an integrated circuit having active components, conductors and isolation regions on a substrate, comprising the steps of:
    patterning and etching a portion of at least one of said isolation regions to expose a first area of said substrate;
    depositing a mask layer over said integrated circuit including said first area;
    patterning and etching said mask layer to expose a second area of said substrate within said first area;
    converting a portion of said substrate to a selectively etchable material, wherein said selectively etchable material lies in an area subjacent to said second area and extends therethrough to the bottom surface of said substrate, and wherein said mask layer protects said active components;
    forming at least one dielectric layer over said substrate;
    forming at least one patterned conductive layer over said dielectric layer; and
    selectively etching said selectively etchable material from the backside to form a void.

2. The method of claim 1, wherein said mask layer is comprised of silicon carbide.

3. The method of claim 2, wherein said mask layer has a thickness in the range of 500–5000 Å.

4. The method of claim 1, wherein said selectively etchable material extends only partially to said bottom surface of said substrate, and wherein said substrate is thinned from said bottom surface to expose said selectively etchable material.

5. The method of claim 1, wherein said substrate is converted to porous silicon.

6. The method of claim 5, wherein said mask layer is comprised of silicon carbide.

7. The method of claim 5, wherein said void is backfilled with a dielectric.

8. The method of claim 5, wherein said conductive layer is comprised of metal.

9. The method of claim 5, wherein said step of patterning and etching said isolation region forms angled sidewalls having a slope between 30° and 60° degrees.

10. A method of producing an integrated circuit having active components, conductors and isolation regions on a substrate, comprising the steps of:
    patterning and etching at a portion of at least one of said isolation regions to expose a first area of said substrate;
    depositing a layer of silicon carbide over said substrate including said first area;
    patterning and etching said silicon carbide layer to expose a second area of said substrate within said first area;
    forming a porous silicon region in said second area using HF, wherein said silicon carbide layer protects said active components from the HF;
    forming at least one dielectric layer over said substrate;
    forming at least one patterned metallization layer over said dielectric layer;
    removing said porous silicon from backside to form a void; and
    backfilling said void left by said removal with a dielectric.

11. A method of fabricating an integrated circuit having active components, conductors and isolation regions on a substrate, comprising the steps of:
    patterning and etching a portion of at least one of said isolation regions to expose a first area of said substrate;
    depositing a mask layer over said integrated circuit including said first area;
    patterning and etching said mask layer to expose a second area of said substrate within said first area;
    converting a portion of said substrate to a selectively etchable material, wherein said selectively etchable material lies in an area subjacent to said second area and extends only partially to the bottom surface of said substrate;

selectively etching said selectively etchable material to form a void;

removing said mask layer to expose said isolation region;

depositing a dielectric layer over said void wherein said dielectric layer extends at least to the height of said isolation region and covers the top surface of said substrate;

polishing the surface of said dielectric layer until the surface is planar and the top surface of said isolation region is exposed; and forming at least one patterned conductive layer over the surface of said dielectric layer that is coplanar with the surface of said isolation region.

12. The method of claim 11, wherein said mask layer is comprised of silicon carbide.

13. The method of claim 12, wherein said mask layer has a thickness in the range of 500–5000 Å.

14. The method of claim 12, wherein said substrate is converted to porous silicon.

15. The method of claim 14, wherein said mask layer is comprised of silicon carbide.

16. The method of claim 15, wherein said conductive layer is comprised of metal.

17. The method of claim 16, wherein said step of patterning and etching said isolation region forms angled sidewalls having a slope between 30° and 60° degrees.

18. The method of claims 15, wherein said substrate is thinned by back-grinding to expose said dielectric backfilling said void.

19. A method of fabricating a silicon wafer which has a topside and a backside, and has a substrate with active component areas and inactive areas, comprising the steps of:

forming said active components on said wafer topside in active component areas of said substrate;

depositing a layer of a masking material over said wafer topside including an isolation region in a first portion of said inactive area of the substrate, said masking material being resistant to a porous-silicon-formation process;

patterning and etching said masking material layer to expose a second area of said substrate within said first portion of said inactive area;

forming a porous silicon region in said second area;

forming an inter-level dielectric layer over said wafer;

forming a patterned conductor layer over said interlevel dielectric layer including over said porous silicon region;

exposing the said porous silicon by a backside wafer thinning;

removing said porous silicon from backside to form a void; and filling said void left by said removal with a dielectric.

20. The method of claim 19, wherein said step of patterning and etching said isolation region comprises an isotropic plasma etch using $CF_4/O_2$.

21. The method of claim 19, wherein said step of patterning and etching said isolation region comprises an HF etch.

22. The method of claim 19, wherein said step of forming said porous silicon region comprises anodization in a HF electrolyte and a current density in the range of 50–200 $mA/cm^2$.

23. The method of claim 19, wherein said step of forming said porous silicon region comprises a two-step anodization process, wherein the first step occurs at a current density in the range of 1–10 $A/cm^2$ and the second step occurs at a current density in the range of 50–200 $mA/cm^2$.

24. The method of claim 19, wherein said step of patterning and etching forms angled sidewalls having a slope between 30 □ and 60 □ degrees.

25. The method of claim 24, where said step of patterning and etching comprises anisotropic plasma etch using $CF_4/O_2$.

26. The method of claim 24, wherein said step of patterning and etching comprises an HF etch.

27. The method of claim 26, further comprising the step of forming an oxide layer over the substrate prior to said step of patterning and etching.

28. The method of claim 26, wherein said step of exposing the porous silicon from the backside further comprises the step of thinning the wafer.

29. The method of claim 26, wherein said step of exposing the porous silicon from the backside further comprises the step of additional anodization by penetrating the backside.

30. The method of claim 26, wherein said step of drying out porous silicon is accomplished at a temperature of 150° C. in vacuum for up to twenty four (24) hours.

31. The method of claim 30, further comprising the step of placing said porous silicon in oven at a temperature between 300° C. and 400° C. in oxygen for at least one (1) hour.

32. The method of claim 31, further comprising the step of oxidizing in oxygen at a temperature beginning at 200° C., increasing to between 300° C. and 400° C., shifting from oxygen to nitrogen, then ending at 200° C.

* * * * *